US006987027B2

(12) United States Patent
Jin

(10) Patent No.: US 6,987,027 B2
(45) Date of Patent: Jan. 17, 2006

(54) MICROSCALE VACUUM TUBE DEVICE AND METHOD FOR MAKING SAME

(75) Inventor: Sungho Jin, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/646,502

(22) Filed: Aug. 23, 2003

(65) Prior Publication Data

US 2004/0075379 A1 Apr. 22, 2004

Related U.S. Application Data

(60) Provisional application No. 60/405,588, filed on Aug. 23, 2002.

(51) Int. Cl.
*H01L 21/00* (2006.01)

(52) U.S. Cl. .............................. 438/20; 445/24; 445/50

(58) Field of Classification Search .................. 438/20; 445/24, 50

See application file for complete search history.

(56) References Cited

U.S. PATENT DOCUMENTS

| | | | | |
|---|---|---|---|---|
| 4,149,076 | A | 4/1979 | Albert | 378/98.6 |
| 5,079,112 | A | 1/1992 | Berger et al. | 430/4 |
| 5,399,860 | A | 3/1995 | Miyoshi et al. | 250/310 |
| 5,532,496 | A | 7/1996 | Gaston | 250/492.22 |
| 5,629,790 | A | 5/1997 | Neukermans et al. | 359/198 |
| 5,637,539 | A | 6/1997 | Hofmann et al. | 438/20 |
| 5,701,014 | A | 12/1997 | Berger et al. | 250/492.22 |
| 5,811,916 | A | 9/1998 | Jin et al. | 313/311 |
| 5,904,561 | A | 5/1999 | Tseng | 438/643 |
| 5,982,095 | A | 11/1999 | Jin et al. | 313/582 |
| 6,028,689 | A | 2/2000 | Michalicek et al. | 359/224 |
| 6,062,931 | A | 5/2000 | Chuang et al. | 445/24 |
| 6,069,599 | A | 5/2000 | Py et al. | 345/74.1 |
| 6,103,305 | A | 8/2000 | Friedmann et al. | 427/249.7 |
| 6,124,650 | A | 9/2000 | Bishop et al. | 310/40 |
| 6,141,470 | A | 10/2000 | Espindola et al. | 385/37 |
| 6,187,604 | B1 | 2/2001 | Gilton | 438/20 |
| 6,201,631 | B1 | 3/2001 | Greywall | 359/245 |
| 6,283,812 | B1 | 9/2001 | Jin et al. | 445/24 |
| 6,297,063 | B1 | 10/2001 | Brown et al. | 438/2 |
| 6,297,592 | B1 | 10/2001 | Goren et al. | 315/3.5 |
| 6,333,968 | B1 | 12/2001 | Whitlock et al. | 378/136 |
| 6,391,670 | B1 * | 5/2002 | Wells et al. | 438/20 |
| 6,401,526 | B1 | 6/2002 | Dai et al. | 73/105 |
| 6,411,020 | B1 | 6/2002 | Yaniv et al. | 313/310 |
| 6,465,132 | B1 | 10/2002 | Jin | 429/231.8 |

(Continued)

FOREIGN PATENT DOCUMENTS

| | | |
|---|---|---|
| EP | 1 184 888 | 3/2002 |

OTHER PUBLICATIONS

Gilmour, Jr., A.S., "Microwave Tubes," Artech House, pp. 191–313 (1986).

(Continued)

*Primary Examiner*—Richard A. Booth
(74) *Attorney, Agent, or Firm*—Lowenstein Sandler PC

(57) ABSTRACT

The invention comprises a method of fabricating a vacuum microtube device comprising the steps of forming a cathode layer comprising an array of electron emitters, forming a gate layer comprising an array of openings for passing electrons from the electron emitters, and forming an anode layer for receiving electrons from the emitters. The cathode gate layer and the anode layer are vertically aligned and bonded together with intervening spacers on a silicon substrate so that electrons from respective emitters pass through respective gate openings to the anode. The use of substrate area is highly efficient and electrode spacing can be precisely controlled. An optional electron multiplying structure providing secondary electron emission material can be disposed between the gate layer and the anode in the path of emitted electrons.

4 Claims, 6 Drawing Sheets

U.S. PATENT DOCUMENTS

| | | | | |
|---|---|---|---|---|
| 6,489,349 B1 | 12/2002 | Thomas et al. | 250/423 F |
| 6,512,235 B1 | 1/2003 | Eitan et al. | 250/423 F |
| 6,519,075 B2 | 2/2003 | Carr et al. | 359/291 |
| 6,525,461 B1 | 2/2003 | Iwasaki et al. | |
| 6,538,367 B1 | 3/2003 | Choi et al. | 313/309 |
| 6,545,425 B2 | 4/2003 | Victor | 315/169.3 |
| 5,566,704 A1 | 5/2003 | Choi et al. | 257/314 |
| 6,574,026 B2 | 6/2003 | Jin et al. | 359/224 |
| 6,620,640 B2 | 9/2003 | Gilton | 438/20 |
| 6,653,228 B2 | 11/2003 | Choi et al. | 438/637 |
| 6,660,959 B2 | 12/2003 | Vallance et al. | 219/121.18 |
| 6,664,727 B2 | 12/2003 | Nakamoto | 313/495 |
| 6,673,392 B2 | 1/2004 | Lee et al. | 427/249.1 |
| 6,692,568 B2 | 2/2004 | Cuomo et al. | 117/84 |
| 6,741,019 B1 | 5/2004 | Filas et al. | 313/355 |
| 2002/0137242 A1 * | 9/2002 | Gilton | 438/20 |
| 2002/0146853 A1 * | 10/2002 | Karpov et al. | 438/20 |
| 2002/0158342 A1 | 10/2002 | Tuominen et al. | 257/784 |
| 2003/0034244 A1 | 2/2003 | Yasar et al. | 204/192.3 |
| 2003/0071246 A1 | 4/2003 | Grigorov et al. | |
| 2003/0096104 A1 | 5/2003 | Tobita et al. | 428/332 |
| 2003/0230753 A1 | 12/2003 | Stecki et al. | 257/89 |

OTHER PUBLICATIONS

Brodie, I., et al., "Vacuum Microelectronics," Advances in Electronics and Electron Physics, vol. 83, pp. 1–106 (1992).

Bower, C., et al., "On–chip vacuum microtriode using carbon nanotube field emitters," Applied Physics Letters, vol. 80, No. 20, pp. 3820–3822 (May 20, 2002).

Rinzler, A.G., et al., "Unraveling Nanotubes: Field Emission from an Atomic Wire," Science, vol. 269, pp. 1550–1553 (Sep. 15, 1995).

de Heer, Walt A., et al., "A Carbon Nanotube Field–Emission Electron Source," Science, vol. 270, pp. 1179–1180 (Nov. 17, 1995).

Saito, Y., et al., "Field Emission Patterns from Single–Walled Carbon Nanotubes," Jpn. J. Appl. Phys., vol. 36, Part 2, No. 10A, pp. L1340—L1342 (Oct. 1, 1997).

Wang, Q.H., et al., "Field emission from nanotube bundle emitters at low fields," Appl. Phys. Lett., vol. 70, No. 24, pp. 3308–3310 (Jun. 16, 1997).

Saito, Y., et al., "Cathode Ray Tube Lighting Elements with Carbon Nanotube Field Emitters," Jpn. J. Appl. Phys., vol. 37, Part 2, No. 3B, pp. L346–L348 (Mar. 15, 1998).

Wang, Q.H., et al., "A nanotube–based field emission flat panel display," Applied Physics Letters, vol. 72, No. 22, pp. 2912–2913 (Jun. 1, 1998).

Bonard, Jean–Marc, et al., "Field emission from single–wall carbon nanotube films," Applied Physics Letters, vol. 73, No. 7, pp. 918–920 (Aug. 17, 1998).

Liu, J., et al., "Fullerene Pipes," Science, vol. 280 pp. 1253–1256 (May 22, 1998).

Li, W.Z., et al., "Large–Scale Synthesis of Aligned Carbon Nanotubes," Science, vol. 274, pp. 1701–1703 (Dec. 6, 1996).

Tans, Sander J., et al., "Individual single–wall carbon nanotubes as quantum wires," Nature, vol. 386, pp. 474–477 (Apr. 3, 1997).

Fan, S., et al., "Self–Oriented Regular Arrays of Carbon Nanotubes and Their Field Emission Properties," Science, vol. 283, pp. 512–514 (Jan. 22, 1999).

Bower, C., et al., "Nucleation and growth of carbon nanotubes by microwave plasma chemical vapor deposition," Applied Physics Letters, vol. 77, No. 17, pp. 2767–2769 (Oct. 23, 2000).

Dean, K., et al., "The environmental stability of field emission from single–walled carbon nanotubes," Applied Physics Letters, vol. 75, No. 19, pp. 3017–2019 (Nov. 8, 1999).

Adachi, H., et al., "Stable carbide field emitter," Appl. Phys. Lett., vol. 43, No. 7, pp. 702–703 (Oct. 1, 1993).

Huang, M., et al., "Room–Temperature Ultraviolet Nanowire Nanolasers," Science, vol. 292, pp. 1897–1899 (Jun. 8, 2001).

Aggarwal, S., et al., "Spontaneous Ordering of Oxide Nanostructures," Science, vol. 287, pp. 2235–2237 (Mar. 24, 2000).

Luo, Y., et al., "Nanoshell tubes of ferroelectric lead zirconate titanate and barium titanate," Applied Physics Letters, vol. 83, No. 3, pp. 440–442 (Jul. 21, 2003).

Ren, Z.F., et al., "Synthesis of Large Arrays of Well–Aligned Carbon Nanotubes on Glass," Science, vol. 282, pp. 1105–1107 (Nov. 6, 1998).

Bower, C., "Plasma–induced alignment of carbon nanotubes," Applied Physics Letters, vol. 77, No. 6, pp. 830–832 (Aug. 7, 2000).

Merkulov, V., "Shaping carbon nanostructures by controlling the synthesis process," Applied Physics Letters, vol. 79, No. 8, pp. 1178–1180 (Aug. 20, 2001).

Teo, K., et al., "Plasma enhanced chemical vapour deposition carbon nanotubes/nanofibres–how uniform do they grow?," Nanotechnology, vol. 14, pp. 204–211 (2003).

Mackie, W., et al., "Emission and Processing Requirements for Carbide Films on Mo Field Emitters," Mat. Res. Soc. Symp. Proc., vol. 509, pp. 173–178 (1998).

Zhu et. al., "Large Current Density from Carbon Nanotube Field Emitters," Applied Physics Letters, vol. 75, No. 6, pp. 873–875 (1999).

Betzig, E. et al., "Near–Field Optics: Microscopy, Spectroscopy, and Surface Modification Beyond the Diffraction Limit", Science, vol. 257, pp. 189–195 (Jul. 10, 1992).

Cheng et al., "Bulk morphology and diameter distribution of single–walled carbon nanotubes synthesized by catalytic decomposition of hydrocarbons", Chem. Physics Letters, vol. 289, pp. 602–610 (1998).

Andrews et al., Chem. Physics Letters, "Continuous production of aligned carbon nanotubes: a step closer to commercial realization", vol. 303, pp. 464–474 (1999).

Jessensky, O. et al., "Self–organized formation of hexagonal pore arrays in anodic alumina", Journal of Applied Physics, vol. 72, pp. 1173 (1998).

Li, A.P. et al., Journal of Applied Physics, vol. 84, No. 11 pp. 6023–6026 (1998).

Scott, A.W., Understanding Microwaves, Ch. 12, pp. 282–317 (1993).

Spindt, C.A. et al., "Field–Emitter–Array Development for High Frequency Operation," J. Vac. Sci., Technol. B, vol. 11, pp. 468–473 (1993).

Kong, Y.C. et al., "Ultraviolet–emitting ZnO nanowires synthesized by a physical vapor deposition approach", Applied Physics Letters, vol. 78, No. 4, pp 407–409 (2001).

Tsai, C.L. et al., "Bias effect on the growth of carbon nanotips using microwave plasma chemical vapor deposition", Applied Physics Letters, vol. 81, No. 4, pp. 721–723 (2002).

Li, Chao et al., "$In_2O_3$ nanowires as chemical sensors", Applied Physcis Letters, vol. 82, No. 10, pp. 1613–1615 (2003).

Rouse, Ambrosio A. et al., "Field emission from molybdenum carbide", Applied Physics Letters, vol. 76, No. 18, pp. 2583–2585 (2000).

* cited by examiner

MICROSCALE VACUUM TUBE DEVICE AND METHOD FOR MAKING SAME

CROSS REFERENCE TO RELATED APPLICATIONS

This application claims the benefit of U.S. Provisional Application Ser. No. 60/405,588 filed by Sungho Jin on Aug. 23, 2002, which application is incorporated herein by reference.

FIELD OF THE INVENTION

The invention relates to microwave vacuum tube devices and, in particular, to microscale vacuum tubes (microtubes).

BACKGROUND OF THE INVENTION

The modem communications industry began with the development of gridded vacuum tube amplifiers. Microwave vacuum tube devices, such as power amplifiers, are essential components of microwave systems including telecommunications, radar, electronic warfare and navigation systems. While semiconductor microwave amplifiers are available, they lack the power capabilities required by most microwave systems. Vacuum tube amplifiers, in contrast, can provide microwave power which is higher by orders of magnitude. The higher power levels are because electrons can travel faster in vacuum with fewer collisions than in semiconductor material. The higher speeds permit larger structures with the same transit time which, in turn, produce greater power output.

In a typical microwave tube device, an input signal interacts with a beam of electrons. The output signal is derived from the thus-modulated beam. See, e.g., A. S. Gilmour, Jr., *Microwave Tubes,* Artech House, 1986, 191–313. Microwave tube devices include triodes, tetrodes, pentodes, klystrodes, klystrons, traveling wave tubes, crossed-field amplifiers and gyrotrons. All contain a cathode structure including a source of electrons for the beam, an interaction structure (grid or gate), and an output structure (anode). The grid is used to induce or modulate the beam.

Conventional vacuum tube devices are typically fabricated by mechanical assembly of the individual components. The components are made separately and then they are secured on a supporting structure. Unfortunately, such assembly is not efficient or cost-effective, and it inevitably introduces misalignment and asymmetry into the device. Attempts to address these problems have led to use of sacrificial layers in a rigid structure, i.e., a structure is rigidly built with layers or regions that are removed in order to expose or free the components of the device. See, e.g., U.S. Pat. No. 5,637,539 and I. Brodie and C. Spindt, "Vacuum microelectronics," *Advances in Electronics and Electron Physics,* Vol. 83 (1992). These rigid structures present improvements, but still encounter formidable fabrication problems.

The usual source of beam electrons is a thermionic emission cathode. The emission cathode is typically formed from tungsten that is either coated with barium or barium oxide, or mixed with thorium oxide. Thermionic emission cathodes must be heated to temperatures around 1000 degrees C. to produce sufficient thermionic electron emission current, e.g., on the order of amperes per square centimeter. The necessity of heating thermionic cathodes to such high temperatures creates several problems. The heating limits the lifetime of the cathodes, introduces warm-up delays, requires bulky auxiliary equipment for cooling, and interferes with high-speed modulation of emission in gridded tubes.

While transistors have been miniaturized to micron scale dimensions, vacuum tubes have been much more difficult to miniaturize. This difficulty arises in part because the conventional approach to fabricating vacuum tubes becomes increasingly difficult as component size is reduced. The difficulties are further aggravated because the high temperature thermionic emission cathodes used with conventional vacuum tubes present increasingly serious heat and reliability problems in miniaturized tubes.

A promising new approach to microminiaturizing vacuum tubes is the use of surface micromachining to make microscale triode arrays using cold cathode emitters such as carbon nanotubes. See Bower et al., *Applied Physics Letters,* Vol. 80, p. 3820 (May 20, 2002). This approach forms tiny hinged cathode, grid and anode structures on a substrate surface and then manually releases them from the surface to lock into proper positions for a triode.

FIGS. 1A and 1B illustrate the formation of a triode microtube using this approach. FIG. 1(*a*) shows the microtube components formed on a substrate 1 before release. The components include surface precursors for a cathode 2, a gate 3 and an anode 4, all releasably hinged to the substrate 1. The cathode 2 can comprise carbon nanotube emitters 5 grown on a region of polysilicon. The gate 3 can be a region of polysilicon provided with apertures 6, and the anode 4 can be a third region of polysilicon. The polysilicon regions can be lithographically patterned in a polysilicon film disposed on a silicon substrate. The carbon nanotubes can be grown from patterned catalyst islands in accordance with techniques well known in the art. The high aspect ratio of the nanotubes (>1000) and their small tip radii of curvature (~1 to 30 nm), coupled with their high mechanical strength and chemical stability, make them particularly attractive as electron emitters. FIG. 1B shows the components after the release step, which is typically manually assisted. Release aligns the gate 3 between the cathode 2 and the anode 4 in triode configuration.

FIG. 2, which is useful in illustrating a problem to which the present invention is directed, is a scanning electron microphoto which shows an exemplary surface micromachined triode device. On the surface of the device substrate 10, e.g., a silicon nitride surface on a silicon wafer, are formed a cathode electrode 12 attached to the device substrate 10 by a hinge mechanism 13 and a spring 11. A grid 14 is attached to the device substrate 10 by a hinge mechanism 15, and an anode 16 is attached to the device substrate 10 by a hinge mechanism 17. Also on the substrate 10 are contacts 18 electrically connected to the cathode electrode 12, grid 14, and anode 16. The contacts 18 and connective wiring are typically polysilicon coated with gold, although other materials are possible. Design of the connective wiring should take into account the subsequent rotation of the cathode electrode 12, grid 14, and anode 16, to avoid breakage and/or reliability problems. The substrate 10 also has three locking mechanisms 24, 26, 28, which secure the cathode 12, grid 14, and anode 16 in an upright position, as discussed below. All these components, including the hinges, are formed by surface micromachining. The inset is a magnified view of the aligned and patterned carbon nanotubes (deposited on cold cathode), placed against the MEMS gate electrode (grid) 14 with corresponding openings.

The cathode electrode 12, with attached emitters 19, the grid 14, and the anode 16, are surface micromechanical and then mechanically rotated on their hinges, 13, 15, 17 and brought to an upright position substantially perpendicular to the surface of the device substrate 10. The locking mechanisms 24, 26, 28 are then rotated on their hinges to secure the cathode electrode 12, grid 14, and anode 16 in these upright positions. Vacuum sealing and packaging of the structure are then effected by conventional techniques.

In operation, a weak microwave signal to be amplified is applied between the grid and the cathode. The signal applied to the grid controls the number of electrons drawn from the cathode. During the positive half of the microwave cycle, more electrons are drawn. During the negative half, fewer electrons are drawn. This modulated beam of electrons passes through the grid and goes to the anode. A small voltage on the grid controls a large amount of current. As this current passes through an external load, it produces a large voltage, and the gridded tube thereby provides gain. Because the spacing between the grid and the cathode can be very small, a microtube (or other gridded tube) can potentially operate at very high frequencies on the order of 1 GHz or more.

The advantage of the surface micromachining is that little additional mechanical assembly is needed to construct a three dimensional structure. However, in order to achieve mechanical release and to maintain the three dimensional configuration achieved, the surface micromachined MEMS devices need mechanical parts such as flaps, support plates, notches, and hinges which take up significant real estate on the device surface.

While microtube device function has been demonstrated, the field emission efficiency needs further improvements. The intensity and performance of electron field emission are strongly dependent on the electric field applied between the cathode and the gate (grid) and the field between the cathode and the anode. The cathode-gate gap spacing needs to be controlled to a few micrometers. The manual flip-up of the micromachined electrodes into the desired vertical position fails to provide consistent control of the cathode-gate gap spacing, especially if there are inhomogeneities in the height of the nanotube emitters. Accordingly there is a need for an improved method of making vacuum microtube devices having more efficient use of substrate area and more precisely controlled electrode spacing.

SUMMARY OF THE INVENTION

The invention comprises a method of fabricating a vacuum microtube device comprising the steps of forming a cathode layer comprising an array of electron emitters, forming a gate layer comprising an array of openings for passing electrons from the electron emitters, and forming an anode layer for receiving electrons from the emitters. The cathode gate layer and the anode layer are vertically aligned and bonded together with intervening spacers on a silicon substrate so that electrons from respective emitters pass through respective gate openings to the anode. The use of substrate area is highly efficient and electrode spacing can be precisely controlled. An optional electron multiplying structure providing secondary electron emission material can be disposed between the gate layer and the anode in the path of emitted electrons.

BRIEF DESCRIPTION OF THE DRAWINGS

The nature, advantages and various additional features of the invention will appear more fully upon consideration of the illustrative embodiments now to be described in detail in connection with the accompanying drawings. In the drawings.

It is to be understood that the drawings are for purposes of illustrating the concepts of the invention and are not to scale.

DETAILED DESCRIPTION OF THE INVENTION

In accordance with the invention, the cathode, gate and anode of a vacuum microtube device are fabricated as separate layers. The device or an array of devices is then formed by vertically aligning and assembling the layers. More specifically, a cathode layer is fabricated with an array of electron emitters (preferably carbon nanotubes); a gate layer is made comprising an array of openings to pass electrons from the emitters; and an anode layer is made with one or more electrode regions to receive electrons from the emitters. The cathode layer, the gate layer and the anode layer are vertically aligned and bonded together on a silicon substrate with intervening spacers so that electrons from the emitters pass through the gate openings to the anode layer.

The term "microtube" as used herein refers to a silicon chip supported vacuum tube amplifier for high frequency RF or microwave power wherein the cathode-grid distance is less than about 100 micrometers and preferably less than 20 micrometers. The cathode-anode distance is typically less than 2000 micrometers and preferably less than 500 micrometers. The active area of each cathode in a cathode array is typically less than one square millimeter and preferably less than 0.1 square millimeter. The term covers all gridded microtubes including silicon chip supported triodes, tetrodes, pentrodes, and klystrodes.

Figure 3:
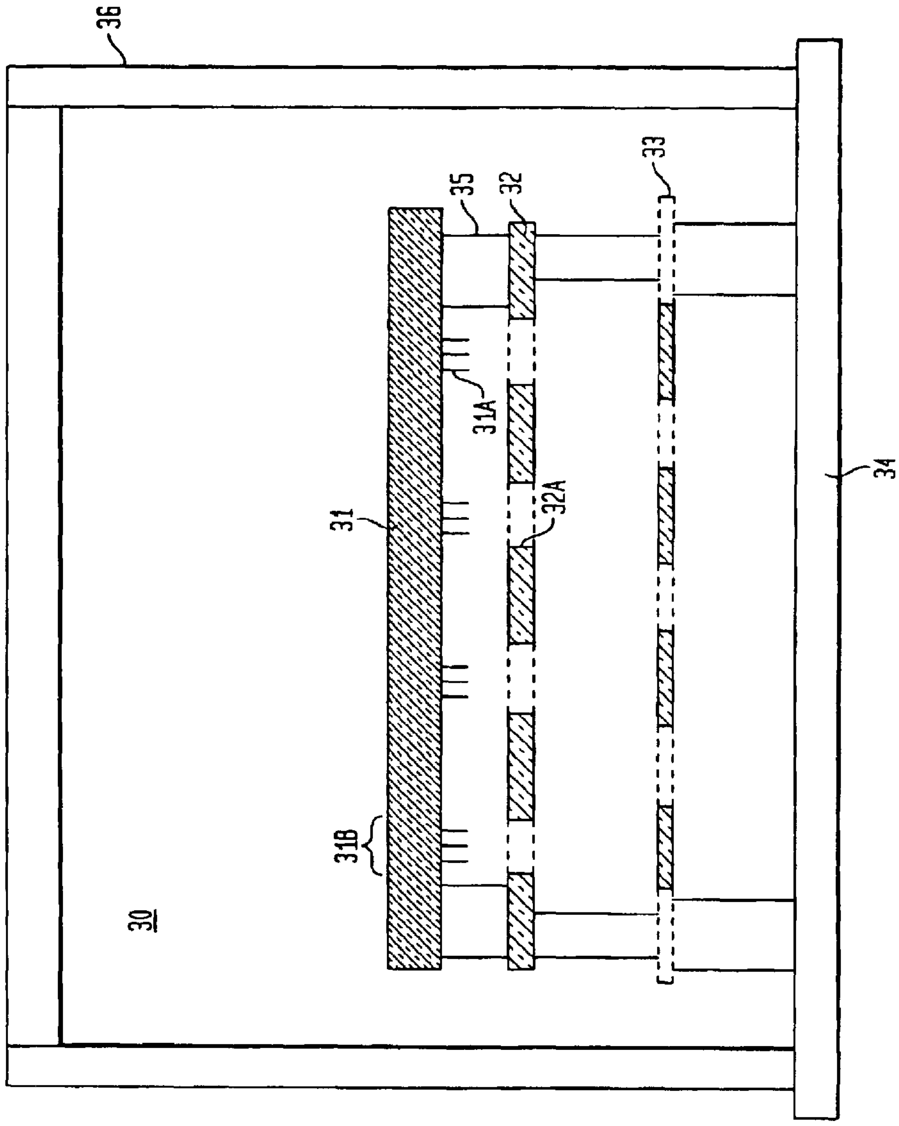
FIG. 3 schematically illustrates an improved vacuum microtube device according to the invention.

FIG. 3 schematically illustrates a typical vacuum microtube device 30 made by this process. The device 30 comprises a cathode layer 31, a gate layer 32 and anode layer 33 all aligned and vertically assembled on a substrate 34. The cathode layer 31 contains an array of electron emitters 31A, such as carbon nanotubes, preferably arranged in a linear or two-dimensional array of cathode cells 31B. Spaced adjacent the cathode layer 31, the gate layer 32 has a corresponding array of apertures 32A, each aperture with dimensions of the order one to several micrometers in effective diameter. A metallization coating (not shown) and even optional electrical circuits can be added to the surface of gate layer 32. Typical metallization is a Cr or Mo coating of 50–200 nanometers thickness. The anode layer 33 is paterned into one or more metallized regions for detection of emission current.

The three layers 31, 32, 33 are shown vertically aligned and assembled by bonding with spacers 35 onto the substrate 34. The device 30 typically operates in a vacuum enclosure 36 and provides a high density array of amplifier devices ($1000/cm^2$ and preferably $3000/cm^3$).

Figure 4:
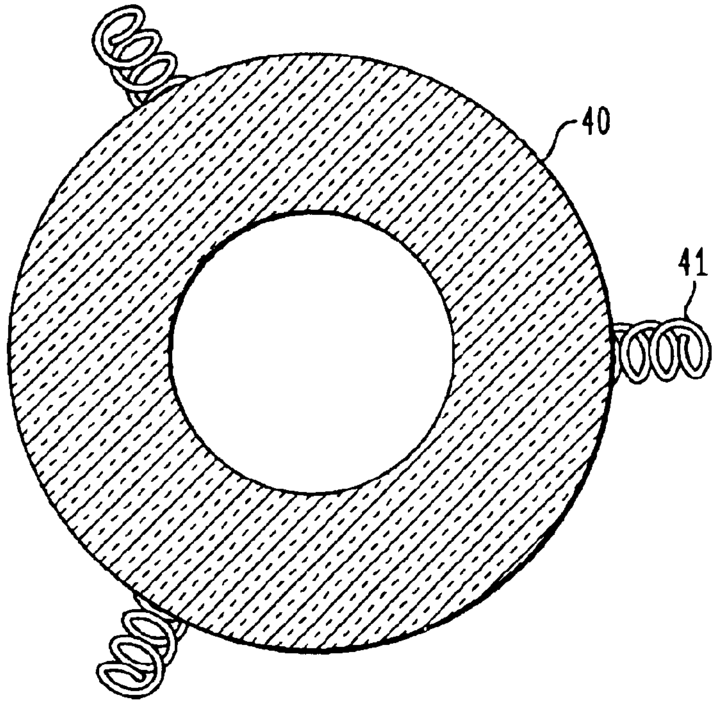
FIG. 4 shows an optional movable gate component which can be used in the device of FIG. 3.

While the spacers provide much improved control of the spacing between the stacked components, even further control can be provided by optional arrangements to tune the gate/cathode spacing. Specifically, the gates can be movable, and the vertical position of each movable gate can be magnetically adjusted and latched. FIG. 4 illustrates an exemplary tunable gate 40 connected by resilient elements 41.

Figure 5:
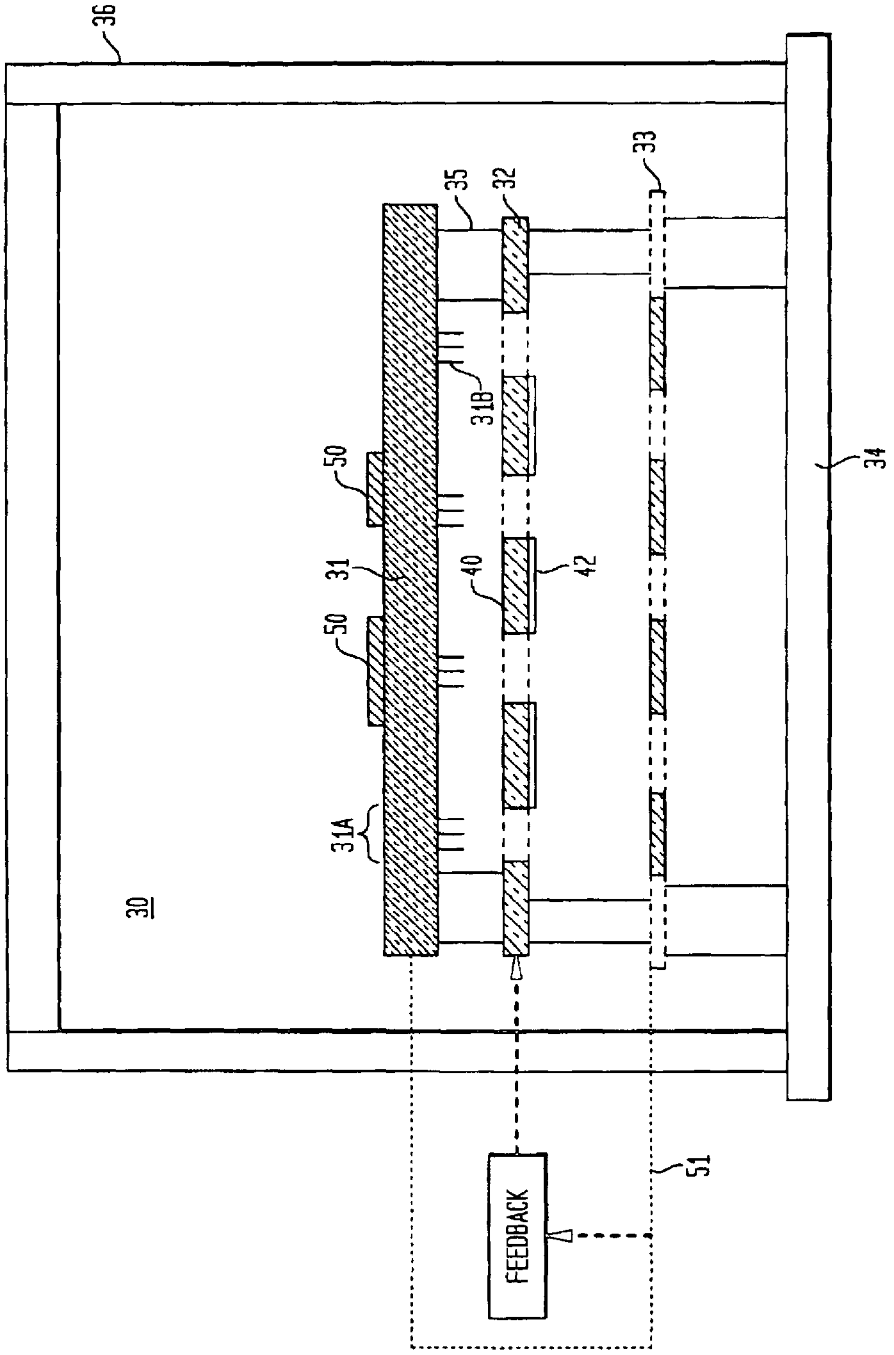
FIG. 5 schematically illustrates an optional feedback arrangement for providing automatic gate/cathode spacing in the device of FIG. 3.

Referring to FIG. 5, the back side of member 40 (the side not facing the cathode) can be coated with a magnetic soft material 42 such as 80% Ni-20% Fe alloy. An array of magnets 50 can be deposited on the backside of cathode 30. Preferably the magnets are of square-loop, semi-hard magnetic material (with a desired coercivity of 5–200 Oe, preferably 10–50 Oe, for example, Fe-33% Cr-7% Co alloy). An array of magnetic-field generators (not shown) is also provided. The generators can be an array of thin-film solenoids or an array of thin-film lines, which magnetize (desirably using a short pulse magnetic field of the order of micro-to-milli seconds) the semi-hard magnets 50 to the various desired magnetic strength level.

The magnets 50 pull the movable gates 40 toward the cathode according to the magnetic strength provided to the semi-hard magnet. Because of the magnetic latchability, the magnetic force remains, and hence the altered gate position maintained, even after the magnetic field is removed. If the gate position is needs to be readjusted, a different type and intensity of magnetic field is applied. The placement of soft magnets vs semi-hard magnets can be reversed between the cathode side vs gate side. Further details concerning such magnetically latchable position adjustment are described in U.S. Pat. No. 6,141,470 issued on Oct. 31, 2000 to Espindola, et al., entitled "Magnetically reconfigurable optical grating devices and communication systems", and U.S. Pat. No. 6,124,650 issued on Sep. 26, 2000 to Bishop, et al., entitled "Non-volatile MEMS micro-relays using magnetic actuators", both of which are incorporated herein by reference.

Advantageously, a feedback arrangement 51 can be provided to tune the gate/cathode spacing. For example, a feedback arrangement responsive to the cathode/anode current can supply a feedback signal to the magnetic field generators.

Figure 6:
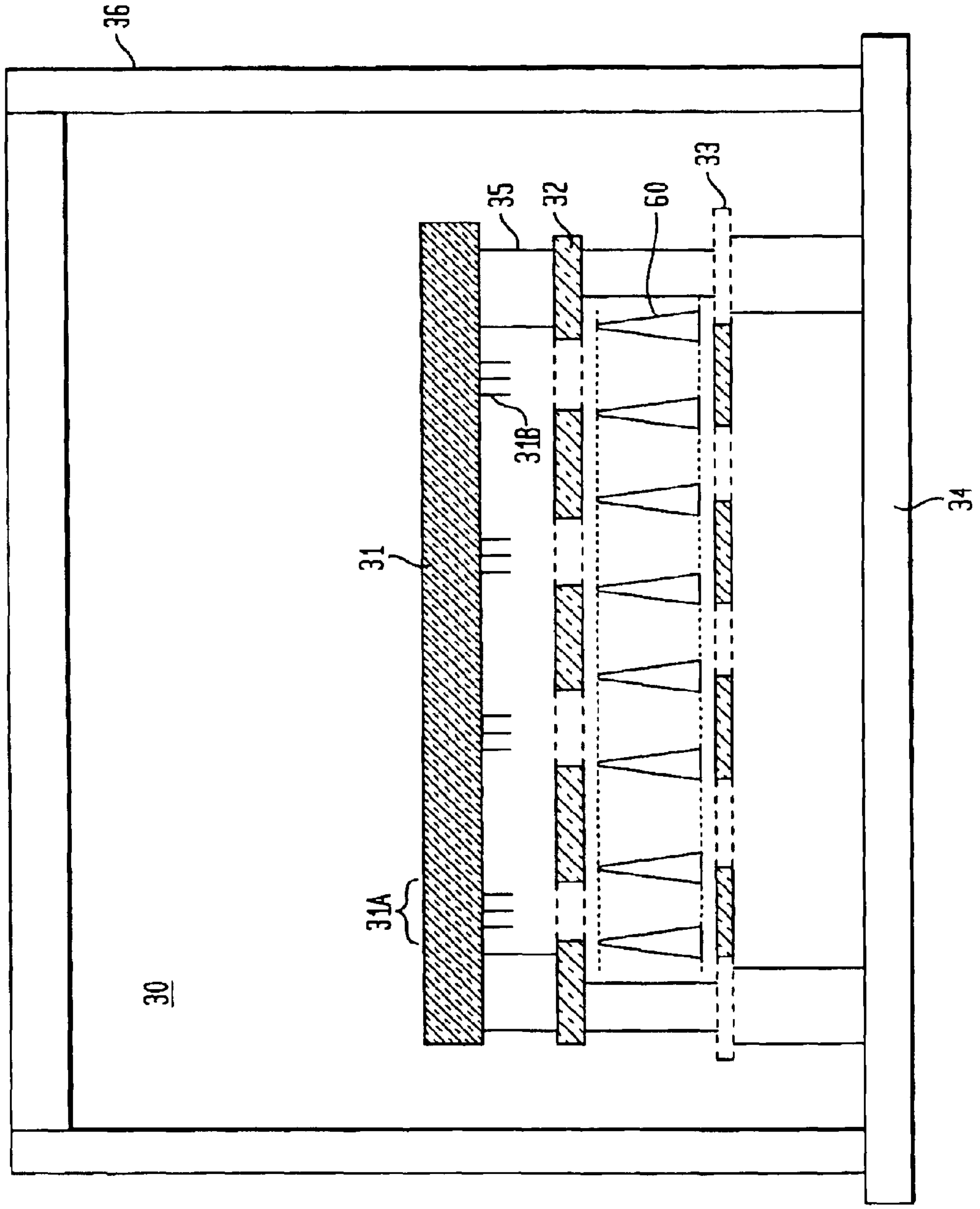
FIG. 6 shows an optional electron amplification arrangement which can be used in the device of FIG. 3.

FIG. 6 illustrates an alternative form of the FIG. 3 device provided with optional secondary electron emitters for increased efficiency and higher electron emission currents. In the vacuum microtube device of FIG. 6 the emission currents are amplified by directing the emitted electrons to secondary electron emitters 60 having surfaces of material with a high secondary electron emission coeffecient. While there are many such materials, diamond surfaces with a high secondary electron emission coeffecient of ~50 are particularly desirable. Each electron bombarding the diamond surface produces ~50 secondary emission electrons. In order to incorporate a diamond surface into the device, a CVD diamond coating can be applied onto patterned and apertured silicon layer prior to the assembly, for example, using the deposition processes described in U.S. Pat. No. 5,811,916, "Field Emission Devices Employing Enhanced Diamond Field Emitters" issued to Jin et al. on Sep. 22, 1998, which is incorporated herein by reference.

The exemplary secondary electron emitters 60 form an array of angled apertures. Various alternative other shapes and configurations can be utilized to optimize electron multiplication including subdivided holes, straight vertical holes, and zig-zag cross-sectioned holes. In the improved MEMS design incorporating such electron-multiplying structure, the amplification efficiency estimated by the emission current is improved by at least a factor of 2, and preferably at least a factor of 5.

The devices of FIGS. 3–6 can be fabricated by a bulk micromachining such as the SOI (silicon-on-insulator) process. This process involves patterning, lithography, wet etching, dry etching (such as reactive ion etch), and metallization. Such fabrication processes are described in detail in the literature, for example, see "Fundamentals of Microfabrication" by Marc Madou, CRC Press, New York 1997; "Micromachined Transducers—Source Book" by Gregory T. A. Kovacs, McGraw Hill, New York 1998, and U.S. Patent Applications No. 20020054422-A1 (published May 9, 2002), "Packaged MEMs Device and Method for Making the Same" by Carr et al., and No. 20020071166-A1 (published Jun. 13, 2002), "Magnetically Packaged Optical MEMs Device and Method for Making the Same" by Jin et al, all of which are incorporated herein by reference.

For electron field emitters 31A, a variety of cold cathode emitter materials can be used, including carbon nanotubes, diamond, and amorphous carbon. Carbon nanotubes are particularly attractive as field emitters because their high aspect ratio (>1,000), one-dimensional structure, and small tip radii of curvature (~10 nm) tend to effectively concentrate the electric field. In addition, the atomic arrangement in a nanotube structure imparts superior mechanical strength and chemical stability, both of which make nanotube field emitters robust and stable.

It is possible to prepare carbon nanotubes by a variety of techniques, including carbon-arc discharge, chemical vapor deposition via catalytic pyrolysis of hydrocarbons, laser ablation of a catalytic metal-containing graphite target, or condensed-phase electrolysis. Depending on the method of preparation and the specific process parameters, the nanotubes are produced multi-walled, single-walled, or as bundles of single-walled tubules, and can adopt various shapes such as straight, curved, planar-spiral and helix. Carbon nanotubes are typically grown in the form of randomly oriented, needle-like or spaghetti-like mats. However, oriented nanotube structures are also possible, as reflected in Ren et al., *Science,* Vol. 282, 1105, (1998); Fan et al., *Science,* Vol. 283, 512 (1999), which are incorporated herein by reference. Carbon nanotube emitters are also discussed, for example, in Rinzler et al., *Science,* Vol. 269, 1550 (1995); De Heer et al., *Science*, Vol. 270, 1179 (1995); Saito et al., *Jpn. J. Appl. Phys.,* Vol. 37, L346 (1998); Wang et al., *Appl. Phys. Lett.,* Vol. 70, 3308, (1997); Saito et al., *Jpn. J. Appl. Phys.,* Vol. 36, L1340 (1997); Wang et al., *Appl. Phys. Lett.,* Vol. 72, 2912 (1998); and Bonard et al., *Appl. Phys. Lett.,* Vol. 73, 918 (1998).

It is possible to form carbon nanotube emitters on a substrate by either in-situ growth or post-deposition spraying techniques. For in-situ growth in the invention, the device substrate, with mask in place over the components other than the cathode electrode surface, is generally placed in a chemical vapor deposition chamber, and pre-coated with a thin layer (e.g., 1–20 nm thick) of catalyst metal such as Co, Ni or Fe (or formed from such a metal). The gas chemistry is typically hydrocarbon or carbon dioxide mixed with hydrogen or ammonia. Depending on specific process conditions, it is possible to grow the nanotubes in either an aligned or random manner. Optionally, a plasma enhanced chemical vapor deposition technique is used to grow highly aligned nanotubes on the substrate surface. Other techniques are also possible.

In a typical post-deposition technique, pre-formed and purified nanotube powders are mixed with solvents and optionally binders (which are pyrolized later) to form a solution or slurry. The mixture is then disposed, e.g., dispersed by spray, onto the masked device substrate in which the cathode electrode surface is exposed. The cathode electrode optionally is provided with a layer of a carbon dissolving element (e.g., Ni, Fe, Co) or a carbide forming element (e.g., Si, Mo, Ti, Ta, Cr), to form a desired emitter structure. Annealing in either air, vacuum or inert atmosphere is followed to drive out the solvent, leaving a nanotube emitter structure on the substrate. And where the carbon dissolving or carbide forming elements are present, annealing promotes improved adhesion. Other post-deposition techniques are also possible.

The diameters of the field-emitting nanotubes are typically about 1 to 300 nm. The lengths of the nanotubes are typically about 0.05 to 100 $\mu$m. To maintain a small gap between the cathode and the grid, and thereby achieve a reduced transit time and a higher operating frequency, the nanotubes advantageously exhibit or are trimmed to a relatively uniform height, e.g., at least 90% of the nanotubes have a height that varies no more than 20% from the average height.

Because of the nanometer scale of the nanotubes, the nanotube emitters provide many potential emitting points, typically more than $10^9$ emitting tips per square centimeter assuming a 10% area coverage and 10% activated emitters from 30 nm (in diameter) sized nanotubes. The emitter site density in the invention is typically at least $10^3/cm^2$, advantageously at least $10^4/cm^2$ and more advantageously at least $10^5/cm^2$. The nanotube-containing cathode requires a turn-on field of less than 2 V/$\mu$m to generate 1 nA of emission current, and exhibits an emission current density of at least 0.1 $A/cm^2$, advantageously at least 0.5 $A/cm^2$, at an electric field of 5 to 50 V/$\mu$m.

Figure 1A:
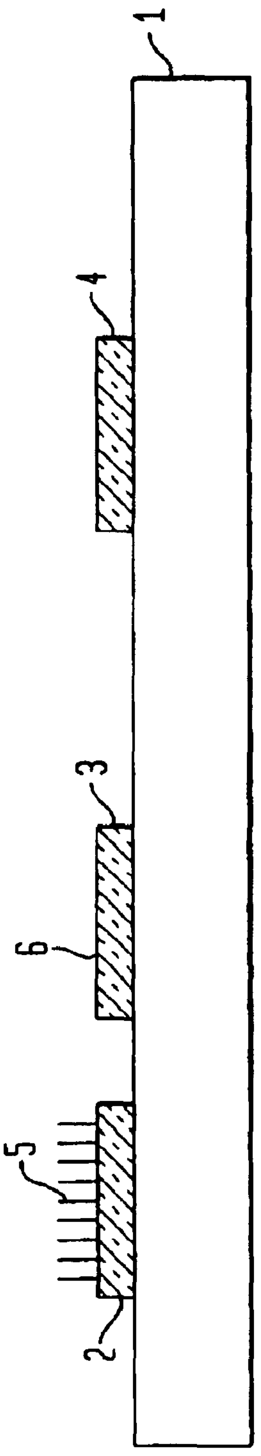
FIG. 1A (PRIOR ART)
FIGS. 1(*a*) and (*b*), which are prior art, illustrate typical fabrication of a MEMS-based vacuum microtriode using surface micromachining.
Figure 1B:
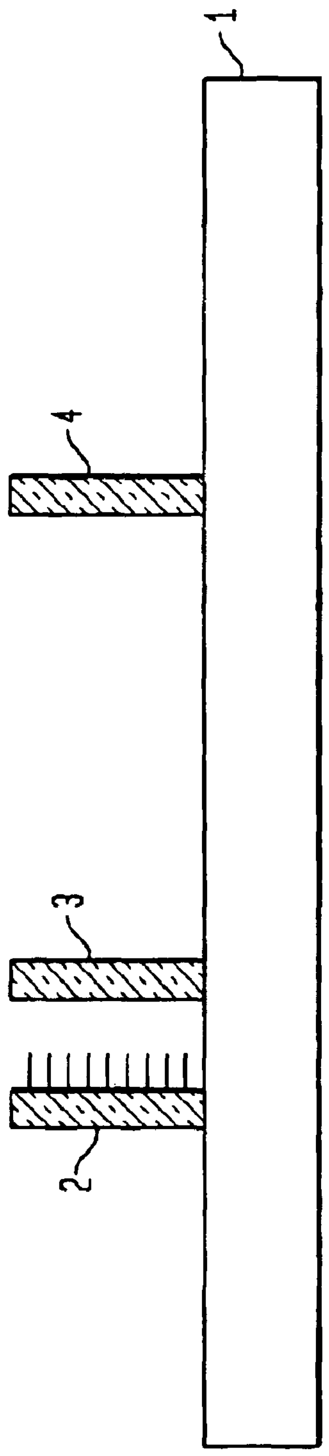
FIG. 1B (PRIOR ART)
Figure 2:
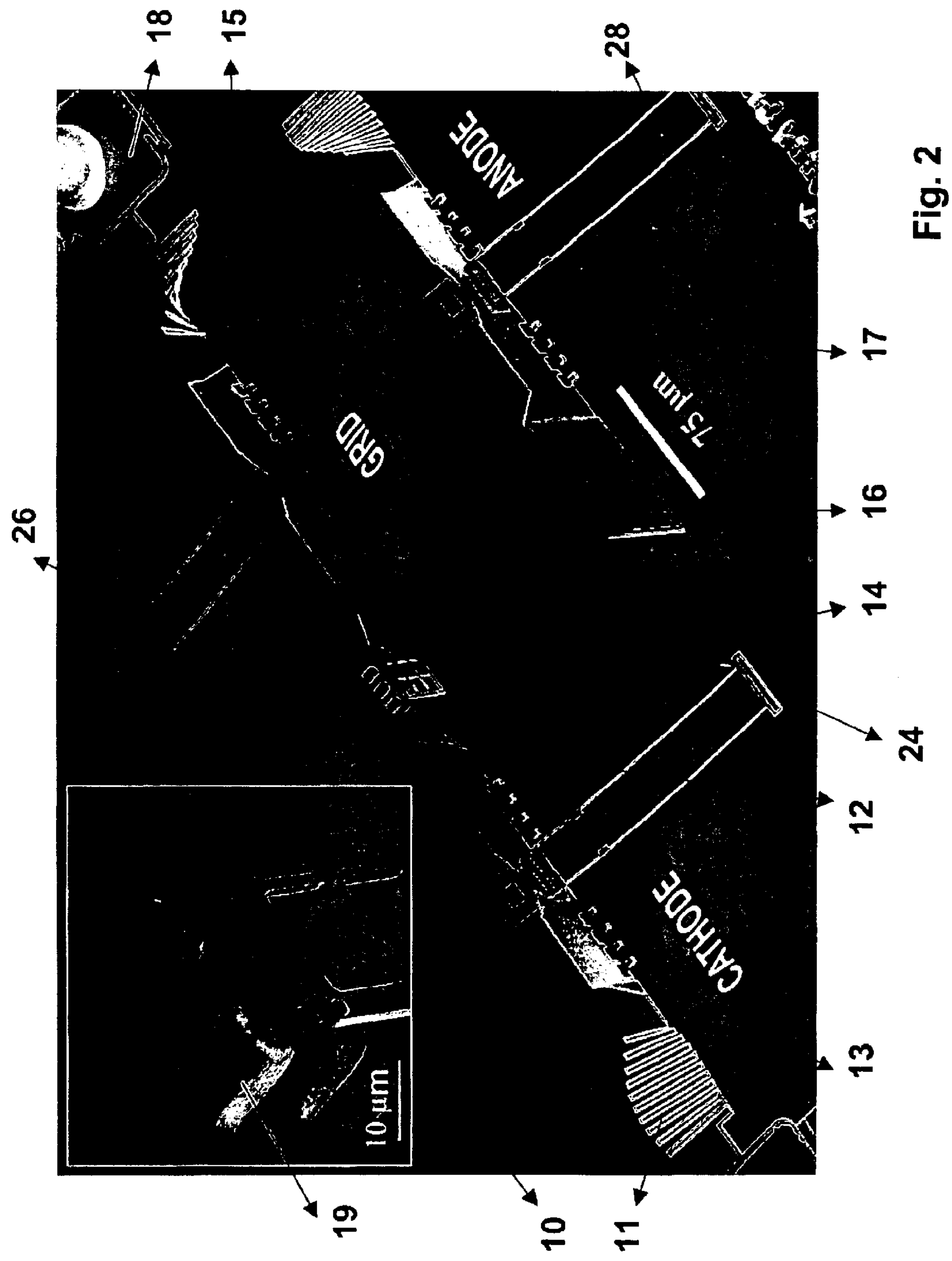
FIG. 2, which is prior art, depicts a MEMS-based vacuum microtriode device.

Nanotube emitters are formed on the cathode electrode, for example, by a microwave plasma enhanced chemical vapor deposition technique. After a mask is placed over the device substrate—leaving the cathode electrode surface exposed, a thin layer, e.g., a few nanometer thick, nucleation layer of Co, Fe, or Ni can be sputter-deposited through the opening onto the cathode electrode. This layer serves as catalyst for nanotube nucleation. The structure is then transferred in air to a microwave plasma enhanced chemical vapor deposition (MPECVD) system to start the nanotube growth. A typical CVD deposition of nanotube can be carried out at a temperature of 700–1000 C. in flowing hydrogen in 2–100 minutes. A microwave plasma of ammonia ($NH_3$) and 10 to 30 vol. % acetylene ($C_2H_2$) can be used for the nanotube growth. As shown in FIG. 2, the nanotubes grown under these conditions are aligned. Because the nanotube growth is highly selective, with growth occurring only in areas where cobalt is present, the nanotubes are substantially confined on the cathode in an area defined by the opening in the mask through which cobalt is deposited.

The vertical three-dimensional assembly of the layers can be accomplished by aligning them and bonding, for example, by soldering at ~100–300° C., epoxy curing at ~room temperature –200° C., polyimide curing at –250–400° C., glass frit bonding (sometimes called glass solder bonding) at 400–700° C., anodic bonding at 400–900° C., or mechanical fuxturing at ambient temperature. The gap spacing between the layers determines the electric field for the given magnitude of applied voltage. Therefore, an accurate and reliable establishment of the gap spacing during the assembly and bonding as well as the dimensional stability of the gap during device handling, shipping and operation are important. The accurate lateral alignment of the various layers is also desirable for reliable operation. Such an alignment can be accomplished by a number of different known techniques, for example, laser guided robotics or camera-vision guided assembly, or by utilizing alignment slots and V-grooves commonly used in silicon devices.

It is understood that the above-described embodiments are illustrative of only a few of the many possible specific embodiments which can represent applications of the invention. For example, while the invention has been illustrated in microscale triodes, it is equally applicable to other griddled microtubes including tetrodes, pentrodes and klystrodes. Thus numerous and varied other arrangements can be made by those skilled in the art without departing from the spirit and scope of the invention.

I claim:

1. A method of fabricating a vacuum microtube device comprising the steps of:

forming a cathode layer comprising an array of carbon nanotube electron emitters;

forming a separate gate layer comprising an array of openings for passing electrons from the electron emitters;

forming a separate anode layer comprising an array of anodes for receiving electrons; and vertically aligning and spacing the cathode layer, the gate layer and the anode layer and then bonding them together on a substrate comprising silicon so that electrons from the emitters pass through the gate openings to the anode.

2. The method of claim 1 wherein the cathode layer comprises silicon.

3. The method of claim 1 wherein the cathode layer, the gate layer and the anode layer are bonded together with one or more intervening spacers.

4. The method of claim 1 further comprising the step of disposing between the gate layer and the anode, an electron multiplying structure comprising secondary electron emission material in the path of emitted electrons for multiplying the electron flow between the cathode and the anode.

* * * * *